(12) United States Patent
Li (10) Patent No.: US 11,019,737 B2
(45) Date of Patent: May 25, 2021

(54) FLEXIBLE DISPLAY DEVICE

(71) Applicant: HUIZHOU CHINA STAR OPTOELECTRONICS TECHNOLOGY CO., LTD., Guangdong (CN)

(72) Inventor: Dehua Li, Guangdong (CN)

(73) Assignee: HUIZHOU CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 560 days.

(21) Appl. No.: 15/778,088

(22) PCT Filed: Jan. 25, 2018

(86) PCT No.: PCT/CN2018/074103
§ 371 (c)(1),
(2) Date: May 22, 2018

(87) PCT Pub. No.: WO2019/140709
PCT Pub. Date: Jul. 25, 2019

(65) Prior Publication Data
US 2021/0084780 A1    Mar. 18, 2021

(30) Foreign Application Priority Data

Jan. 16, 2018   (CN) .......................... 201810039148.4

(51) Int. Cl.
*H05K 7/02* (2006.01)
*H05K 7/04* (2006.01)
(Continued)

(52) U.S. Cl.
CPC ......... *H05K 5/0217* (2013.01); *H05K 5/0017* (2013.01)

(58) Field of Classification Search
USPC .......................................................... 361/809
See application file for complete search history.

(56) References Cited

U.S. PATENT DOCUMENTS 9,081,540 B1* 7/2015 Cho ..................... G06F 1/1601
9,116,662 B1* 8/2015 Song .................... G06F 1/1601
(Continued)

FOREIGN PATENT DOCUMENTS

CN   201548815 U   8/2010
CN   202847308 U   4/2013
(Continued)

OTHER PUBLICATIONS

Chinese Office Action issued in corresponding Chinese Application No. 201810039148.4 dated Aug. 5, 2019.

*Primary Examiner* — Hung S. Bui
(74) *Attorney, Agent, or Firm* — Leong C. Lei (57) ABSTRACT

Disclosed is a flexible display device, comprising a display panel, including a backside away from a display side; an elastic strip, fixed to the backside, wherein in a width direction of the elastic strip, the elastic strip comprises a pair of ends and a deformable section located between the pair of ends, and as the elastic strip is flattened in a longitudinal direction, the deformable section arches with respect to the pair of ends, and as the elastic strip is curled in the longitudinal direction, the deformable section is leveled with the pair of ends, and the elastic strip is used to flatten the display panel or curl the display panel. An initial state of the elastic strip is an elastic structure of a curled shape. The flexible display device can be automatically switched from a flattened state to a curled state by simply pressing the deformable section.

13 Claims, 7 Drawing Sheets

(51) Int. Cl.
*H05K 5/02* (2006.01)
*H05K 5/00* (2006.01)

(56) References Cited

U.S. PATENT DOCUMENTS

| | | | |
|---|---|---|---|
| 9,510,440 B2* | 11/2016 | Nam | G06F 1/1652 |
| 9,826,654 B2* | 11/2017 | Fujii | G02F 1/133385 |
| 10,484,642 B2* | 11/2019 | Park | H04N 9/30 |
| 2014/0003006 A1 | 1/2014 | Ahn | |
| 2016/0196782 A1 | 7/2016 | Lee et al. | |

FOREIGN PATENT DOCUMENTS

| | | |
|---|---|---|
| CN | 104299524 A | 1/2015 |
| CN | 104424844 A | 3/2015 |
| CN | 204300864 U | 4/2015 |
| CN | 105044957 A | 11/2015 |
| CN | 106027927 A | 10/2016 |
| CN | 106061154 A | 10/2016 |
| CN | 206302433 U | 7/2017 |
| CN | 107492310 A | 12/2017 |
| CN | 107564415 A | 1/2018 |
| KR | 10-2013-0022067 A | 3/2013 |
| WO | 2016/108296 A1 | 7/2016 |

\* cited by examiner

FLEXIBLE DISPLAY DEVICE

RELATED APPLICATION

The present application is a National Phase of International Application Number PCT/CN2018/074103, filed on Jan. 25, 2018, and claims the priority of China Application No. 201810039148.4, filed on Jan. 16, 2018.

FIELD OF THE INVENTION

The present application relates to a display field, and more particularly to a flexible display device.

BACKGROUND OF THE INVENTION

With the continuous progress of society, the development of liquid crystal displays has been rapid in recent years. For either of the display technology or the design, the current liquid crystal display has achieved a very significant improvement and change compared with the previous products. At present, the display is developed for flexibility. In comparison with conventional displays, the flexible displays can achieve bending with high curvature and expand more applications for displays.

In the prior art, the flexible display screen can only be fixed on a certain curvature arc, that is, the flexible display screen cannot switch between flat display state and bent display state and the user experience is low.

SUMMARY OF THE INVENTION

An objective of the present application is to provide a flexible display device for solving the issue that the flexible display screen cannot be switched between a flat display state and a bent display state and the user experience is low in the prior art.

For solving the aforesaid technical issue, the present application provides a flexible display device, comprising:
  a display panel, including a backside away from a display side;
  an elastic strip, fixed to the backside, wherein in a width direction of the elastic strip, the elastic strip comprises a pair of ends and a deformable section located between the pair of ends, and as the elastic strip is flattened in a longitudinal direction, the deformable section arches with respect to the pair of ends, and as the elastic strip is curled in the longitudinal direction, the deformable section is leveled with the pair of ends, and the elastic strip is used to flatten the display panel or curl the display panel.

The flexible display device further comprises a strengthening rib, wherein the strengthening rib is fixed on the backside, and a vertical projection of the strengthening rib on the backside intersects with the elastic strip.

The flexible display device comprises a plurality of strengthening ribs and a plurality of elastic strips; and a vertical projection of each strengthening rib on the backside intersects with the plurality of elastic strips, and a vertical projection of each elastic strip on the backside intersects with the plurality of strengthening ribs.

A side of the strengthening rib facing the backside is provided with a groove, and the elastic strip passes through the groove, and the elastic strip is fixed between the strengthening rib and the display panel.

The strengthening rib comprises a plurality of grooves, and each elastic strip passes through the grooves of the plurality of strengthening ribs, and the strengthening ribs and the elastic strips overlap and interweave with each other.

The deformation section is provided with a first fixing hole, and the strengthening rib is provided with a second fixing hole, and the first fixing hole and the second fixing hole correspond to the groove, and a fastener passes through the first fixing hole and the second fixing hole to fix the strengthening rib and the elastic strip on the backside.

The fastener is a screw and a screw hole is provided on the backside, and the fastener is inserted through the second fixing hole and the first fixing hole and fixed in the screw hole.

A side of the strengthening rib away from the backside is provided with a groove, and the elastic strip passes through the groove, and the strengthening rib is fixed between the elastic strip and the display panel.

The strengthening rib comprises a plurality of grooves, and each elastic strip passes through the grooves of the plurality of strengthening ribs, and the strengthening ribs and the elastic strips overlap and interweave with each other.

The deformation section is provided with a first fixing hole, and the strengthening rib is provided with a second fixing hole, and the first fixing hole and the second fixing hole correspond to the groove, and a fastener passes through the first fixing hole and the second fixing hole to fix the strengthening rib and the elastic strip on the backside.

The fastener is a screw and a screw hole is provided on the backside, and the fastener is inserted through the first fixing hole and the second fixing hole and fixed in the screw hole.

All the elastic strips are parallel and equally spaced, and all the strengthening ribs are parallel and equally spaced.

The display side of the display panel comprises a display area, and the vertical projections of the elastic strips and the strengthening ribs on the backside are within the display area.

As the elastic strip is flattened in the longitudinal direction, the deformable section arches toward the backside with respect to the pair of ends.

As the elastic strip is flattened in the longitudinal direction, the deformable section arches away from the backside with respect to the pair of ends.

The elastic strip has a long strip shape, and an initial state of the elastic strip is a curled shape.

The benefits of the present application are: the flexible display device has two display modes, the flattened state and the curled state, and the display modes are various. Furthermore, an initial state of the elastic strip is an elastic structure of a curled shape. When the elastic strip is flattened along the longitudinal direction, the deformation section arches to form an arc surface support to offset the curling stress of the elastic strip, thereby straightening the elastic strip, and correspondingly, the elastic strip will flatten the display panel; when the flexible display device needs to be curled, a force is applied to the deformation section to erase the arc surface support of the deformation section, and the curling stress of the elastic strip makes the elastic strip to be curled, and correspondingly, the elastic strip will curl the display panel. The flexible display device can be automatically switched from a flattened state to a curled state by simply pressing the deformable section of the elastic strip. The flexible display device has flexible display modes, and is easy to be switched to improve the user experience.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other obvious variations according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained, should all be considered within the scope of protection of the present application.

Figure 1:
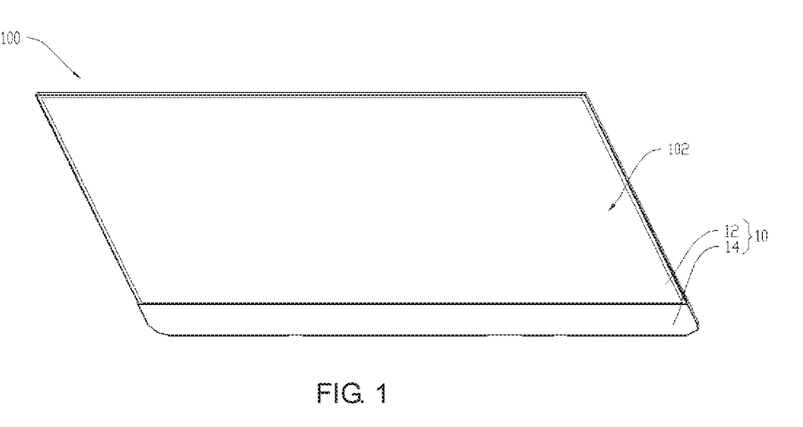
FIG. 1 and FIG. 2 are flattened state diagrams of a flexible display device according to the first embodiment of the present application.
Figure 2:
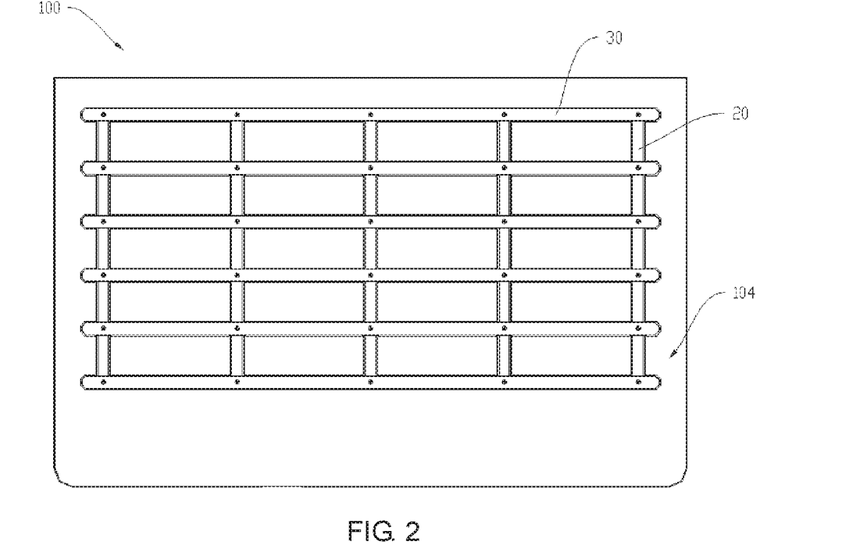

Please refer to FIG. 1 and FIG. 2. The flexible display device 100 provided by the first embodiment of the present application comprises a display panel 10 and an elastic strip 20. The display panel 10 is a component for displaying images of the flexible display device 100. In this embodiment, the display panel 10 is a flexible display panel 10. In one embodiment, the display panel 10 is an Organic Light-Emitting Diode (©LED) display panel. Certainly, in other embodiments, the display panel 10 may also be a Thin Film Transistor-Liquid Crystal Display panel. Furthermore, the display panel 10 may be used only for display. Alternatively, the touch panel may also be integrated to form the display panel 10 with a touch function. In this embodiment, the display panel 10 comprises a display side 102 and a backside 104. The display side 102 is a surface of the display panel 10 outputting the images, and the backside 104 is a surface of the display panel 10 away from the display side 102. In one embodiment, the display side 102 comprises a display area 12 and a non-display area 14. The display area 12 is an area where the display side 102 actually displays the images. The non-display area 14 is arranged at one side of the display area 12. Wirings and circuit boards are arranged in the position inside the display panel 10 corresponding to the non-display area 14. In one embodiment, the entire display panel 10 possesses flexibility. In other words, the portions of the display panel 10 corresponding to the display area 12 and the non-display area 14 can be bent. In other embodiments, the display panel 10 can be bent, partially. Specifically, the portion of the display panel 10 corresponding to the display area 12 may be bent; and the portion of the display panel 10 corresponding to the non-display area 14 may not be bent to protect the circuit board and other elements corresponding to the non-display area 14.

Figure 3:
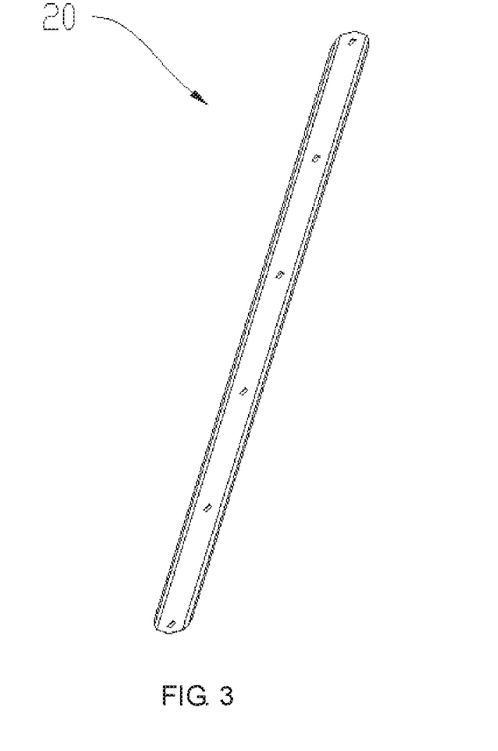
FIG. 3 is a diagram of a flattened elastic strip of a flexible display device according to the first embodiment of the present application.
Figure 4:
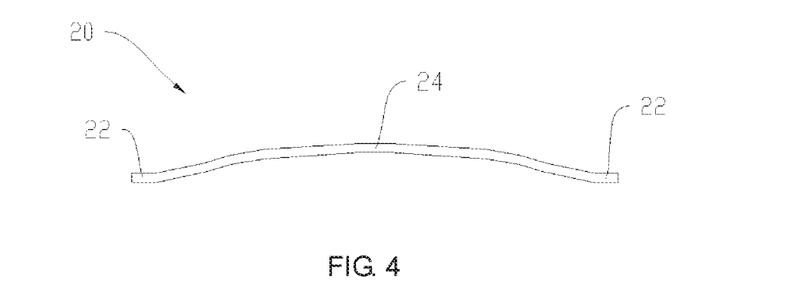
FIG. 4 is a sectional diagram of a flattened elastic strip of a flexible display device according to the first embodiment of the present application.
Figure 5:
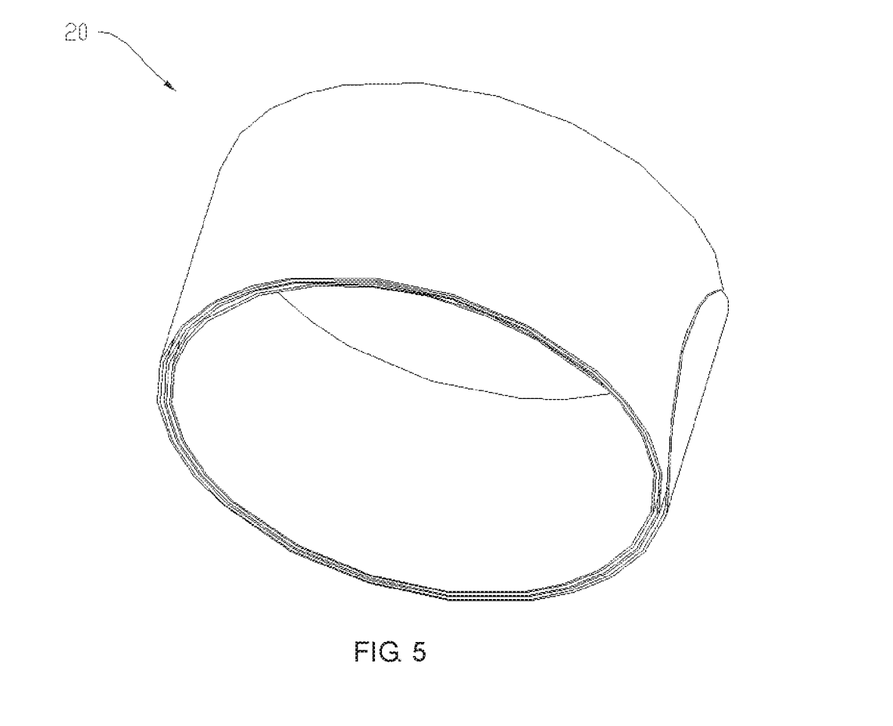
FIG. 5 is a diagram of a curled elastic strip of a flexible display device according to the first embodiment of the present application.
Figure 6:
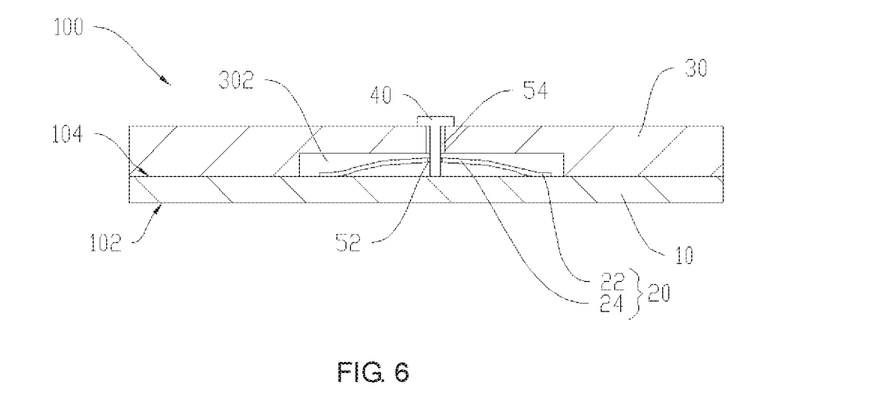
FIG. 6 is a flattened state sectional diagram of a flexible display device according to the first embodiment of the present application.
Figure 7:
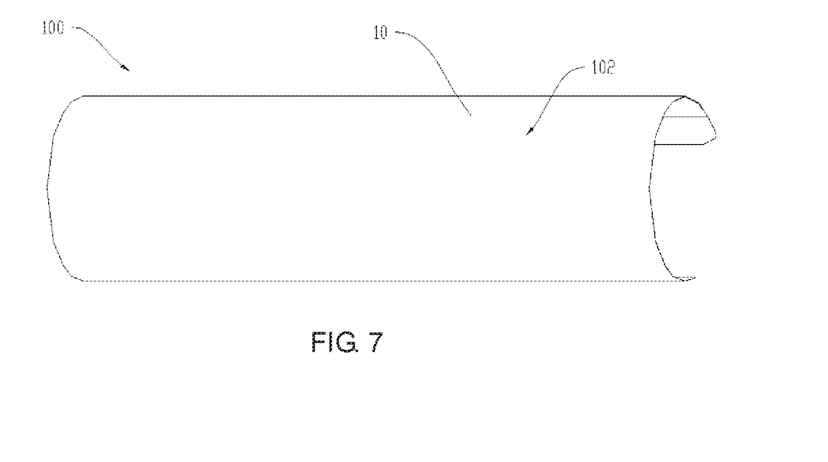
FIG. 7 is a curled state diagram of a flexible display device according to the first embodiment of the present application.

Specifically; as shown in FIG. 2, the elastic strip 20 is fixed on the backside 104. Furthermore, as shown in FIG. 3 to FIG. 5, the elastic strip 20 has a long strip shape; and an initial state of the elastic strip 20 is a curled shape. In one embodiment, the elastic strip 20 is made of an elastic material. As shown in FIG. 4, FIG. 4 is a sectional diagram of the elastic strip 20. In a width direction of the elastic strip 20, the elastic strip 20 comprises a pair of ends 22 and a deformable section 24 located between the pair of ends 22. The deformation section 24 is integrally formed with the ends 22. The elastic strip 20 has two states, a flattened state and a curled state. Specifically, as shown in FIG. 3 and FIG. 4, when the elastic strip 20 is flattened along the longitudinal direction, the deformation section 24 arches with respect to the pair of ends 22 to form an arc surface. The deformation section 24 arches to form the arc surface support to offset the curling stress of the elastic strip 20, thereby straightening the elastic strip 20, that is, the elastic strip 20 is stretched as shown in FIG. 2 and FIG. 3; as shown in FIG. 5, when the elastic strip 20 is curled in the longitudinal direction, the deformable section 24 is leveled with the pair of ends 22, and specifically; a cross section of the elastic strip 20 is rectangular. In this embodiment, the elastic strip 20 is used to flatten the display panel 10 or curl the display panel 10. Specifically as shown in FIG. 6, when the elastic strip 20 is in the flattened state, the elastic strip 20 stretches the display panel 10 so that the display panel 10 is also fixed in a flattened state, that is, the flexible display device 100 is in the flattened state; as shown in FIG. 7, when the elastic strip 20 is in the curled state, the elastic strip 20 curls the display panel 10 so that the display panel 10 is also fixed in a curled state with the same amplitude as the elastic strip 20, that is, the flexible display device 100 is in the curled state.

The flexible display device 100 has two display modes, the flattened state and the curled state, and the display modes are various. Furthermore, an initial state of the elastic strip 20 is an elastic structure of a curled shape. When the elastic strip 20 is flattened along the longitudinal direction, the deformation section 24 arches to form an arc surface support to offset the curling stress of the elastic strip 20, thereby straightening the elastic strip 20, and correspondingly, the elastic strip 20 will flatten the display panel 10; when the flexible display device 100 needs to be curled; a force is applied to the deformation section 24 to erase the arc surface support of the deformation section 24, and the curling stress of the elastic strip 20 makes the elastic strip 20 to be curled, and correspondingly, the elastic strip 20 will curl the display panel 10. The flexible display device 100 can be automatically switched from a flattened state to a curled state by simply pressing the deformable section 24 of the elastic strip 20. The flexible display device 100 has flexible display modes, and is easy to be switched to improve the user experience.

Please refer to FIG. 2. In this embodiment; the flexible display device 100 further comprises a strengthening rib 30.

The strengthening rib 30 is fixed on the backside 104, and a vertical projection of the strengthening rib 30 on the backside 104 intersects with the elastic strip 20. Specifically, the strengthening rib 30 is a rigid, unbendable strip structure. In one embodiment, the strengthening rib 30 is a metal strip. The strengthening rib 30 is fixed on the backside 104 by means of a fastener 40 being pasted. When a certain portion of the strengthening rib 30 is acted by a force, the entire strengthening rib 30 will exert a force on the display panel 10. Specifically, the strengthening rib 30 intersects with the elastic strip 20, When the elastic strip 20 is in the flattened state, the force of the elastic strip 20 on the display panel 10 is applied to a contact position of the display panel 10 and the elastic strip 20. Meanwhile, the elastic strip 20 also exerts a force on the strengthening rib 30, and the elastic strip 20 transfers the force to the strengthening rib 30. The position of the display panel 10 contacting the strengthening rib 30 is acted by a force so as to enlarge an area of the force of the elastic strips 20 on the display panel 10, which is favorable for uniformly applying the force on the backside 104 of the display panel 10.

Please refer to FIG. 2. In this embodiment, the flexible display device comprises a plurality of strengthening ribs 30 and a plurality of elastic strips 20. A vertical projection of each strengthening rib 30 on the backside 104 intersects with the plurality of elastic strips 20, and a vertical projection of each elastic strip 20 on the backside 104 intersects with the plurality of strengthening ribs 30. Specifically, the plurality of strengthening ribs 30 and the plurality of elastic strips 20 intersect with each other and cover the area of the backside 104 corresponding to the display area 12 so that the stress on the backside 104 is uniform. When the flexible display device 100 is in a flattened state, the plurality of elastic strips 20 are flattened to support the display panel 10 from a plurality of positions on the backside 104 so that the display panel 10 remains flat. The strengthening ribs 30 uniformly distribute the forces of the elastic strips 20 on the respective positions of the backside 104. Then, the display panel 10 is uniformly acted by the forces so that the flexible display device 100 can be stably fixed in the flattened state. When the flexible display device 100 is in a curled state, the plurality of elastic strips 20 are in the curled state, and the display panel 10 is stretched from the plurality of positions on the backside 104 to keep the display panel 10 in the curled state. The strengthening ribs 30 uniformly distribute the forces of the elastic strips 20 on the respective positions of the backside 104. Then, the display panel 10 is uniformly acted by the forces so that the flexible display device 100 can be stably fixed in the curled state. In one embodiment, the strengthening rib 30 and the elastic strip 20 are perpendicular to each other.

Please refer to FIG. 2 and FIG. 6. A side of the strengthening rib 30 facing the backside 104 is provided with a groove 302. The elastic strip 20 passes through the groove 302. The elastic strip 20 is fixed between the strengthening rib 30 and the display panel 10. Specifically, the strengthening rib 30 presses the elastic strip 20 on the backside 104 of the display panel 10. The strengthening rib 30 is used to unify the force of the elastic strip 20 and serves to fix the elastic strip 20 and to prevent the elastic strip 20 from falling off. In this embodiment, each strengthening rib 30 comprises a plurality of grooves 302 to allow the plurality of elastic strip 20 passes through. Each elastic strip 20 passes through the grooves 302 of the plurality of strengthening ribs 30, and the strengthening ribs 30 and the elastic strips 20 overlap and interweave with each other.

Still refer to FIG. 2 and FIG. 6. The deformation section 24 is provided with a first fixing hole 52. The strengthening rib 30 is provided with a second fixing hole 54. The first fixing hole 52 and the second fixing hole 54 correspond to the groove 302. A fastener 40 passes through the first fixing hole 52 and the second fixing hole 54 to fix the strengthening rib 30 and the elastic strip 20 on the backside 104, In one embodiment, the fastener 40 is a screw and a screw hole is provided on the backside 104 of the display panel 10, The fastener 40 is inserted through the second fixing hole 54 and the first fixing hole 52 in order, and then fixed in the screw hole, thereby fixing the strengthening rib 30 and the elastic strip 20 on the backside 104. The screw fixation is simple and easy to implement, and the screw stud provides a space for deformation of the deformation section 24.

Please refer to FIG. 2. In this embodiment, all the elastic strips 20 are parallel and equally spaced, and all the strengthening ribs 30 are parallel and equally spaced. The plurality of elastic strips 20 and the plurality of strengthening ribs 30 intersect with each other and cover the backside 104 so that the stress on the backside 104 is uniform. In this embodiment, the display side 102 of the display panel 10 comprises a display area 12, and the vertical projections of the elastic strips 20 and the strengthening ribs 30 on the backside 104 are within the display area 12. The elastic strips 20 and the strengthening ribs 30 only curl the display panel 10 at the positions corresponding to the display area 12 and avoid curling the circuit board and other elements, which are not easily curled.

Please refer to FIG. 6. In one embodiment, when the elastic strip 20 is flattened along the longitudinal direction, the deformation section 24 arches toward the backside 104 with respect to the pair of ends 22. As shown in FIG. 7, when the elastic strip 20 is curled in the longitudinal direction, the display panel 10 is curled and the display side 102 faces outward so that the display angle of the display side 102 of the flexible display device 100 can be increased for viewing by many people at the same time.

The flexible display device 100 has two display modes, the flattened state and the curled state, and the display modes are various. Furthermore, an initial state of the elastic strip 20 is an elastic structure of a curled shape. When the elastic strip 20 is flattened along the longitudinal direction, the deformation section 24 arches to form an arc surface support to offset the curling stress of the elastic strip 20, thereby straightening the elastic strip 20, and correspondingly, the elastic strip 20 will flatten the display panel 10; when the flexible display device 100 needs to be curled, a force is applied to the deformation section 24 to erase the arc surface support of the deformation section 24, and the curling stress of the elastic strip 20 makes the elastic strip 20 to be curled, and correspondingly, the elastic strip 20 will curl the display panel 10. The flexible display device 100 can be automatically switched from a flattened state to a curled state by simply pressing the deformable section 24 of the elastic strip 20. The flexible display device 100 has flexible display modes, and is easy to be switched to improve the user experience.

Figure 8:
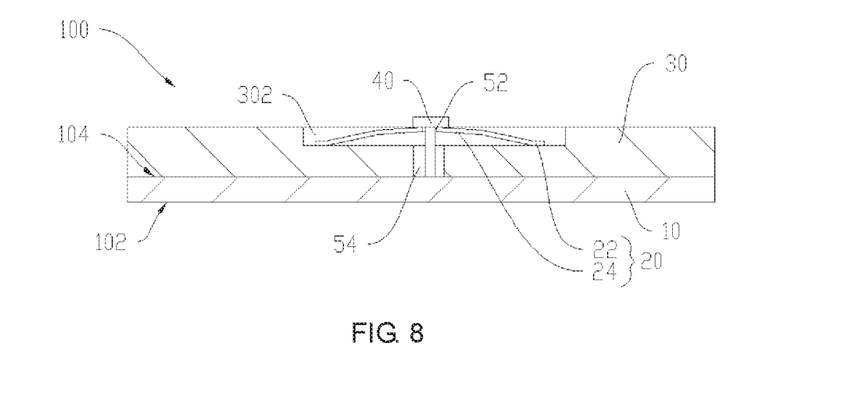
FIG. 8 is a flattened state sectional diagram of a flexible display device provided according to the second embodiment of the present application.

Please refer to FIG. 8. The difference of the flexible display device 100 according to the second embodiment of the present application from the first embodiment is that a side of the strengthening rib 30 away from the backside 104 is provided with a groove 302. The elastic strip 20 passes through the groove 302, and the strengthening rib 30 is fixed between the elastic strip 20 and the display panel 10. Specifically, the elastic strip 20 presses the strengthening rib 30 on the backside 104 of the display panel 10, which is favorable for the elastic strips 20 to exert the force on the strengthening ribs 30, thereby facilitating the strengthening ribs 30 to distribute the forces of the elastic strips 20 at various positions on the backside 104. In this embodiment, each strengthening rib 30 comprises a plurality of grooves 302 to allow the plurality of elastic strip 20 passes through. Each elastic strip 20 passes through the grooves 302 of the plurality of strengthening ribs 30, and the strengthening ribs 30 and the elastic strips 20 overlap and interweave with each other.

Still refer to FIG. 8. The deformation section 24 is provided with a first fixing hole 52. The strengthening rib 30 is provided with a second fixing hole 54. The first fixing hole 52 and the second fixing hole 54 correspond to the groove 302. A fastener 40 passes through the first fixing hole 52 and the second fixing hole 54 to fix the strengthening rib 30 and the elastic strip 20 on the backside 104. In one embodiment, the fastener 40 is a screw and a screw hole is provided on the backside 104 of the display panel 10. The fastener 40 is inserted through the first fixing hole 52 and the second fixing hole 54 in order, and then fixed in the screw hole, thereby fixing the strengthening rib 30 and the elastic strip 20 on the backside 104. The screw fixation is simple and easy to implement, and the screw stud provides a space for deformation of the deformation section 24.

Please refer to FIG. 8. In this embodiment, all the elastic strips 20 are parallel and equally spaced, and all the strengthening ribs 30 are parallel and equally spaced. The plurality of elastic strips 20 and the plurality of strengthening ribs 30 intersect with each other and cover the backside 104 so that the stress on the backside 104 is uniform. In this embodiment, the display side 102 of the display panel 10 comprises a display area 12, and the vertical projections of the elastic strips 20 and the strengthening ribs 30 on the backside 104 are within the display area 12. The elastic strips 20 and the strengthening ribs 30 only curl the display panel 10 at the positions corresponding to the display area 12 and avoid curling the circuit board and other elements, which are not easily curled.

The flexible display device 100 has two display modes, the flattened state and the curled state, and the display modes are various. Furthermore, an initial state of the elastic strip 20 is an elastic structure of a curled shape. When the elastic strip 20 is flattened along the longitudinal direction, the deformation section 24 arches to form an arc surface support to offset the curling stress of the elastic strip 20, thereby straightening the elastic strip 20, and correspondingly, the elastic strip 20 will flatten the display panel 10; when the flexible display device 100 needs to be curled, a force is applied to the deformation section 24 to erase the arc surface support of the deformation section 24, and the curling stress of the elastic strip 20 makes the elastic strip 20 to be curled, and correspondingly, the elastic strip 20 will curl the display panel 10. The flexible display device 100 can be automatically switched from a flattened state to a curled state by simply pressing the deformable section 24 of the elastic strip 20. The flexible display device 100 has flexible display modes, and is easy to be switched to improve the user experience.

Figure 9:
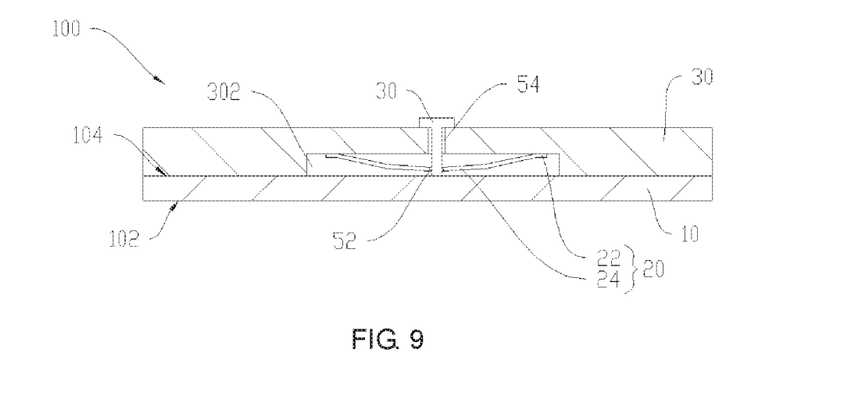
FIG. 9 is a flattened state sectional diagram of a flexible display device provided according to the third embodiment of the present application.
Figure 10:
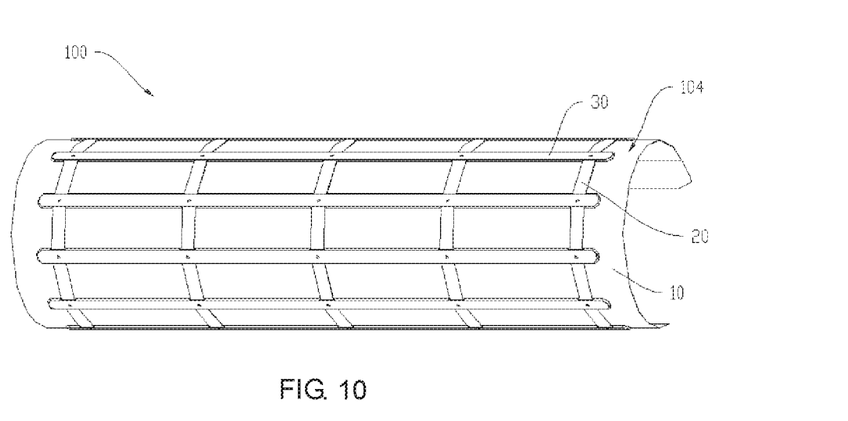
FIG. 10 is a curled state sectional diagram of a flexible display device provided according to the third embodiment of the present application.

Please refer to FIG. 9. The difference of flexible display device 100 according to the third embodiment of the present application from the first embodiment is that when the elastic strip 20 is flattened along the longitudinal direction, the deformation section 24 arches away from the backside 104 with respect to the pair of ends 22. As shown in FIG. 10, when the elastic strip 20 is curled in the longitudinal direction, the display panel 10 is curled and the display side 102 faces inward. The arc-shaped display side 102 increases the viewing angle of the user and gives the user a better visual enjoyment.

The flexible display device 100 has two display modes, the flattened state and the curled state, and the display modes are various. Furthermore, an initial state of the elastic strip 20 is an elastic structure of a curled shape. When the elastic strip 20 is flattened along the longitudinal direction, the deformation section 24 arches to form an arc surface support to offset the curling stress of the elastic strip 20, thereby straightening the elastic strip 20, and correspondingly, the elastic strip 20 will flatten the display panel 10; when the flexible display device 100 needs to be curled, a force is applied to the deformation section 24 to erase the arc surface support of the deformation section 24, and the curling stress of the elastic strip 20 makes the elastic strip 20 to be curled, and correspondingly, the elastic strip 20 will curl the display panel 10. The flexible display device 100 can be automatically switched from a flattened state to a curled state by simply pressing the deformable section 24 of the elastic strip 20. The flexible display device 100 has flexible display modes, and is easy to be switched to improve the user experience.

Above are embodiments of the present application, which does not limit the scope of the present application. Any modifications, equivalent replacements or improvements within the spirit and principles of the embodiment described above should be covered by the protected scope of the application.

What is claimed is:

1. A flexible display device, comprising:
   a display panel, including a backside away from a display side;
   an elastic strip, fixed to the backside, wherein in a width direction of the elastic strip, the elastic strip comprises a pair of ends and a deformable section located between the pair of ends, and as the elastic strip is flattened in a longitudinal direction, the deformable section arches with respect to the pair of ends, and as the elastic strip is curled in the longitudinal direction, the deformable section is leveled with the pair of ends, and the elastic strip is used to flatten the display panel or curl the display panel; and
   a strengthening rib, wherein the strengthening rib is fixed on the backside, and a vertical projection of the strengthening rib on the backside intersects with the elastic strip;
   wherein the flexible display device comprises a plurality of strengthening ribs and a plurality of elastic strips, and a vertical projection of each strengthening rib on the backside intersects with the plurality of elastic strips, and a vertical projection of each elastic strip on the backside intersects with the plurality of strengthening ribs;
   wherein a side of the strengthening rib facing the backside is provided with a groove, and the elastic strip passes through the groove, and the elastic strip is fixed between the strengthening rib and the display panel.

2. The flexible display device according to claim 1, wherein the strengthening rib comprises a plurality of grooves, and each elastic strip passes through the grooves of the plurality of strengthening ribs, and the strengthening ribs and the elastic strips overlap and interweave with each other.

3. The flexible display device according to claim 1, wherein the deformation section is provided with a first fixing hole, and the strengthening rib is provided with a second fixing hole, and the first fixing hole and the second fixing hole correspond to the groove, and a fastener passes through the first fixing hole and the second fixing hole to fix the strengthening rib and the elastic strip on the backside.

4. The flexible display device according to claim 3, wherein the fastener is a screw and a screw hole is provided on the backside, and the fastener is inserted through the second fixing hole and the first fixing hole and fixed in the screw hole.

5. The flexible display device according to claim 1, wherein a side of the strengthening rib away from the backside is provided with a groove, and the elastic strip passes through the groove, and the strengthening rib is fixed between the elastic strip and the display panel.

6. The flexible display device according to claim 5, wherein the strengthening rib comprises a plurality of grooves, and each elastic strip passes through the grooves of the plurality of strengthening ribs, and the strengthening ribs and the elastic strips overlap and interweave with each other.

7. The flexible display device according to claim 5, wherein the deformation section is provided with a first fixing hole, and the strengthening rib is provided with a second fixing hole, and the first fixing hole and the second fixing hole correspond to the groove, and a fastener passes through the first fixing hole and the second fixing hole to fix the strengthening rib and the elastic strip on the backside.

8. The flexible display device according to claim 7, wherein the fastener is a screw and a screw hole is provided on the backside, and the fastener is inserted through the first fixing hole and the second fixing hole and fixed in the screw hole.

9. The flexible display device according to claim 1, wherein all the elastic strips are parallel and equally spaced, and all the strengthening ribs are parallel and equally spaced.

10. The flexible display device according to claim 1, wherein the display side of the display panel comprises a display area, and the vertical projections of the elastic strips and the strengthening ribs on the backside are within the display area.

11. The flexible display device according to claim 1, wherein as the elastic strip is flattened in the longitudinal direction, the deformable section arches toward the backside with respect to the pair of ends.

12. The flexible display device according to claim 1, wherein as the elastic strip is flattened in the longitudinal direction, the deformable section arches away from the backside with respect to the pair of ends.

13. The flexible display device according to claim 1, wherein the elastic strip has a long strip shape, and an initial state of the elastic strip is a curled shape.

\* \* \* \* \*